United States Patent
Ranish et al.

(10) Patent No.: US 8,582,962 B2
(45) Date of Patent: Nov. 12, 2013

(54) SUBSTRATE PROCESSING CHAMBER WITH DIELECTRIC BARRIER DISCHARGE LAMP ASSEMBLY

(75) Inventors: Joseph Michael Ranish, San Jose, CA (US); Kaushal Kishore Singh, Santa Clara, CA (US); Bruce Adams, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/175,452

(22) Filed: Jul. 1, 2011

(65) Prior Publication Data

US 2011/0263138 A1 Oct. 27, 2011

Related U.S. Application Data

(62) Division of application No. 11/380,553, filed on Apr. 27, 2006, now Pat. No. 7,978,964.

(51) Int. Cl.
*A21B 2/00* (2006.01)

(52) U.S. Cl.
USPC .................. 392/416; 392/407; 392/422

(58) Field of Classification Search
None
See application file for complete search history.

(56) References Cited

U.S. PATENT DOCUMENTS

| 4,485,333 A | 11/1984 | Goldberg |
| 5,487,127 A | 1/1996 | Gronet et al. |
| 2004/0045575 A1 | 3/2004 | Kinoshita et al. |

OTHER PUBLICATIONS

Peuse, Bruce, et al., "Advances in RTP Temperature Measurement and Control", Materials Research Society Symposium, Spring 1998, pp. 1-15.
Zhang, Jun-Ying, et al., "Low Temperature Photo-oxidation of Silicon Using a Xenon Excimer Lamp", American Institute of Physics, copywrited 1997, Appl. Phys. Lett., vol. 71, No. 20, Nov. 17, 1997, page count 1-4.
Kogelschatz, U., et al., "High-intensity Sources of Incoherent UV and VUV Excimer Radiation for Low-temperature Materials Processing", Applied Surface Science 168 (2000) 29-36, undated, pp. 29-36.
Kogelschatz, U., "Silent-discharge Driven Excimer UV Sources and Their Applications", Applied Surface Science 54 (1992) 410-423, accepted for publication May 31, 1991, pp. 410-423.
Kogelschatz, U., et al., "From Ozone Generator to Flat Television Screens: History and Future Potential of Dielectric-barrier Discharges", Pure Appl. Chem., vol. 71, Nio. 10, pp. 1819-1828, 1999.
Wagenaars, E., "Low-pressure Dielectric Barrier Discharges in Argon: Experimental Investigations and Modelling", XXVIIth ICPIG, Jul. 2005, pp. 18-22.

*Primary Examiner* — Thor Campbell
(74) *Attorney, Agent, or Firm* — Patterson & Sheridan, LLP

(57) ABSTRACT

A thermal processing chamber with a dielectric barrier discharge (DBD) lamp assembly and a method for using the same are provided. In one embodiment, a thermal processing chamber includes a chamber body and a dielectric barrier discharge lamp assembly. The dielectric barrier discharge lamp assembly further comprises a first electrode, a second electrode and a dielectric barrier. The dielectric barrier discharge lamp assembly is positioned between the first electrode and the second electrode. The dielectric barrier defines a discharge space between the dielectric barrier and the second electrode. A circuit arrangement is coupled to the first and second electrodes, and is adapted to operate the dielectric barrier discharge lamp assembly.

19 Claims, 6 Drawing Sheets

SUBSTRATE PROCESSING CHAMBER WITH DIELECTRIC BARRIER DISCHARGE LAMP ASSEMBLY

CROSS-REFERENCE TO OTHER APPLICATIONS

This application is a divisional application of U.S. patent application Ser. No. 11/380,553, entitled "SUBSTRATE PROCESSING CHAMBER WITH DIELECTRIC BARRIER DISCHARGE LAMP ASSEMBLY", filed Apr. 27, 2006, now U.S. Pat. No. 7,978,964 which is herein incorporated by reference.

BACKGROUND OF THE INVENTION

1. Field of the Invention

The present invention relates generally to a semiconductor processing tool and, more specifically, to a thermal processing tool having dielectric barrier discharge lamp assembly.

2. Description of the Related Art

Rapid thermal processing (RTP) is a process for annealing substrates during semiconductor fabrication. During this process, thermal radiation is used to rapidly heat a substrate in a controlled environment to a temperature of up to and beyond nine hundred degrees Celsius. This temperature is maintained for a specific amount of time ranging from less than one second to several minutes, depending on the process. The substrate is then cooled before further processing.

Conventionally, RTP chambers typically include radiant heat sources or lamps, a chamber body and a substrate support assembly. The substrate support assembly is disposed in the chamber body and supports a substrate while processing. The radiant heat sources are typically mounted to a top surface of the chamber body or embedded in the interior walls of the chamber so that the radiant energy generated by the sources impinge upon the substrate positioned on the substrate support assembly. A quartz window is typically disposed in the top surface of the chamber to isolate radiant heat sources and the interior process region where the substrate typically disposes in the process chamber.

The radiant energy generated by the lamp is in the form of a wave of thermal radiation. The radiation is broadband and typically has a peak wavelength of around 800 nm to around 1500 nm. During transmission through the quartz window to the substrate surface, a portion of the radiant energy may be lost. For example, wavelengths longer than about 4000 nm are not transmitted. The quartz window thus causes a change in wavelength of the radiation energy passing therethrough, which now may be between about 400 nm to about 4000 nm, or even higher, and into the infrared region (IR). These wavelengths of radiant energy are insufficient to drive photochemical reactions on the substrate surface and may further result in an insufficient number of generated reactive species being available to react and form a bulk film on the substrate.

Therefore, there is a need for an improved lamp assembly for use in a thermal processing chamber.

SUMMARY OF THE INVENTION

A thermal processing chamber with a dielectric barrier discharge (DBD) lamp assembly and a method for using the same are provided. In one embodiment, a thermal processing chamber includes a chamber body and a dielectric barrier discharge lamp assembly. The dielectric barrier discharge lamp assembly further comprises a first electrode, a second electrode and a dielectric barrier. The dielectric barrier discharge lamp assembly is positioned between the first electrode and the second electrode. The dielectric barrier defines a discharge space between the dielectric barrier and the second electrode. A circuit arrangement is coupled to the first and second electrodes, and is adapted to operate the dielectric barrier discharge lamp assembly.

In another embodiment, the thermal processing chamber includes a chamber body defining an interior volume and a substrate support assembly disposed in the interior volume of the chamber body. A radiant heat assembly is positioned to direct radiation towards the substrate support through a window formed through the chamber body. A dielectric barrier discharge lamp assembly positioned between the radiant heat assembly and the substrate support, the dielectric barrier discharge lamp assembly adapted to radiate the interior volume of the chamber body.

In yet another embodiment, a method for processing a substrate includes positioning a substrate on a substrate support assembly disposed in a process chamber, exposing the substrate to a radiation energy generated by a radiant heat assembly, and exposing the substrate to a second radiation energy generated by a dielectric barrier discharge lamp assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION OF THE PRESENT INVENTION

Embodiments of present invention provide an apparatus and method for generating a combined IR and UV radiant energy in a thermal processing system. The combined radiant energy is utilized to promote photochemical reactions on the substrate surface, thereby allowing uniform thermal processing on the substrate. The combined radiant energy is obtained using a dielectric barrier discharge (DBD) lamp assembly in a thermal processing system, which advantageously facilitates efficient and uniform substrate processing.

Figure 1:
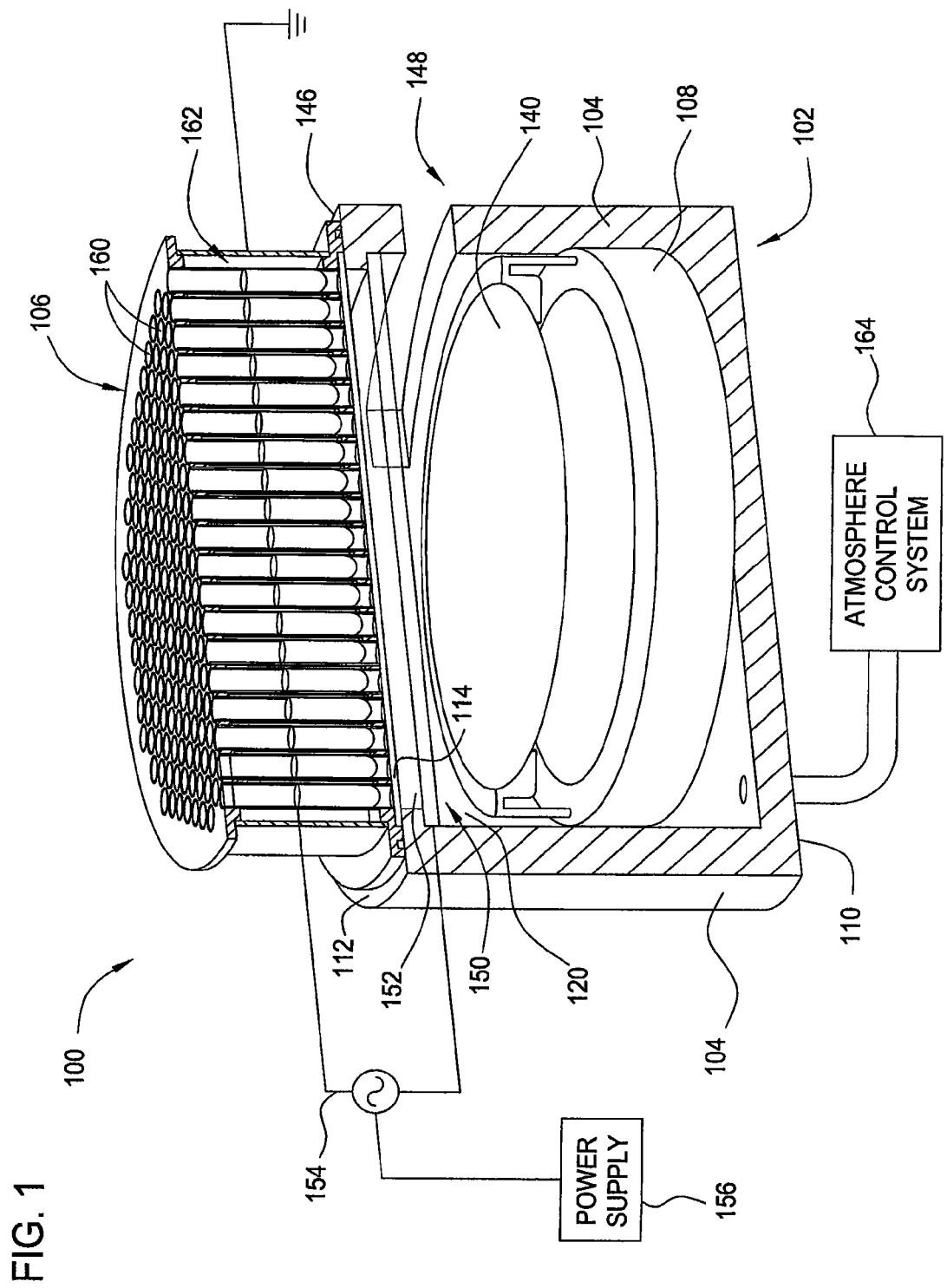
FIG. 1 is a sectional perspective view of one embodiment of a thermal processing chamber with dielectric barrier discharge assembly.

FIG. 1 is a simplified sectional perspective view of one embodiment of a rapid thermal processing chamber 100 having a dielectric barrier discharge (DBD) lamp assembly 150. Examples of rapid thermal processing chambers that may be adapted to benefit from the invention are XEplus and RadiancePlus™ CENTURA® thermal processing system, both available from Applied Material, Inc., located in Santa Clara, Calif. Although the dielectric barrier discharge lamp assembly 150 is described as utilized within the illustrated rapid thermal processing chamber 100, the dielectric barrier discharge lamp assembly 150 may be utilized in other thermal processing systems, such as deposition chambers, etch chambers, and photo-exposure chambers, among others.

The processing chamber 100 includes a chamber body 102 having chamber walls 104, a bottom 110, and a top 112 defining an interior volume 120. The walls 104 typically include at least one substrate access port 148 to facilitate entry and egress of a substrate 140. A quartz window 114 is included in a radiant heat assembly 106 mounted to the top 112 of the chamber body 102. The radiant heat assembly 106 is utilized to heat the substrate 140 positioned in a substrate support 108. The radiant heat assembly 106 includes a plurality of lamp tubes 160 in a water jacket assembly 162. Each tube 160 contains a reflector and a tungsten halogen lamp assembly. The lamp tubes 160 are rested in a honeycomb light pipe arrangement. This close-packed hexagonal arrangement of light pipes provides radiant energy, such as an IR radiation and/or longer wavelength of UV radiation having a wavelength between about 400 nm and about 4000 nm with high-power density. In one embodiment, the radiant heat assembly 106 provides radiant energy to thermally process the substrate, such as annealing a silicon layer disposed on the substrate 140. One radiant heat assembly 106 that may be adapted to benefit from the invention is described in U.S. Pat. No. 5,487,127, issued Jan. 23, 1996 to Gronet, et al., and is hereby incorporated by reference in its entirety.

A dielectric barrier discharge (DBD) lamp assembly 150 is disposed between the radiant heat assembly 106 and the substrate support 108. The DBD lamp 150 comprised of a grounded electrode which is the interior face of the radiant heat assembly 106, a high voltage electrode 202 insulated from the chamber body (insulation not shown in the Figures), and a dielectric barrier 114. In one embodiment, the dielectric barrier is a quartz window for the radiant heat assembly 220. The DBD lamp assembly 150 generates short wavelength radiant energy which is used to promote substrate processing. A discharge space 152 is defined in the DBD lamp assembly 150 into which a discharge gas is supplied. The power supply 156 energizes the discharge gas present in the discharge space 152. The energized discharge gas emits an ultraviolet (UV) radiation, thereby irradiating the substrate with a higher flux of UV radiation than what would be provided by the heat assembly 106 alone. In one embodiment, the radiation energy generated through the DBD lamp assembly 150 includes combined UV radiation and IR radiation having a wavelength from around 100 nm to 4000 nm. In another embodiment, the radiation energy generated by the DBD lamp assembly 150 has an UV radiation and/or IR radiation with a wavelength around 100 nm to 1500 nm.

The substrate support assembly 108 is disposed on the bottom 110 of the chamber 102 to receive the substrate 140 positioned thereon. The substrate support assembly 108 may be configured to rotate the substrate 140, thereby allowing the substrate 140 to be conformally heated by the radiant energy generated by the radiant heat assembly 106 and DBD lamp assembly 150.

A circuit arrangement 154 couples to the dielectric barrier discharge lamp assembly 150 by a power source 156. The circuit arrangement 154 is adapted to provide power to the DBD lamp assembly 150. In operation, the voltage applied to the DBD lamp assembly 150 establishes an electric field to enable the generation of radiant energy by the DBD lamp assembly 150 which promotes the reactions and photochemical process on the surface of the substrate 140, thereby allowing the thermal processing on the substrate 140. Additionally, the radiant heat assembly 106 may have a separate circuit arrangement (not shown) to power the lamps 106 which generate the thermal energy. The thermal energy generated from the radiant heat assembly 106 radiates the surface of the substrate 140 to provide sufficient heat energy. The thermal energy generated from the radiant heat assembly 106 may also augment the radiant energy generated from the DBD lamp 150 which radiates the surface of the substrate 140 to activate the surface of the substrate 140, thereby promoting the reaction on the surface of the substrate 140.

An atmosphere control system 164 is coupled to the interior volume 120 of the chamber body 102. The atmosphere control system 164 includes throttle valves and vacuum pumps for controlling chamber pressure. The atmosphere control system 164 may additionally include gas sources for providing process or other gases to the interior volume 120. In one embodiment, the atmosphere control system 164 provides process gases for thermal deposition process. In another embodiment, the atmosphere control system 164 provides gases for annealing processes. The discharge gas in the region 152 may be supplied by the atmosphere control system or a separate inlet (not shown).

Figure 2:
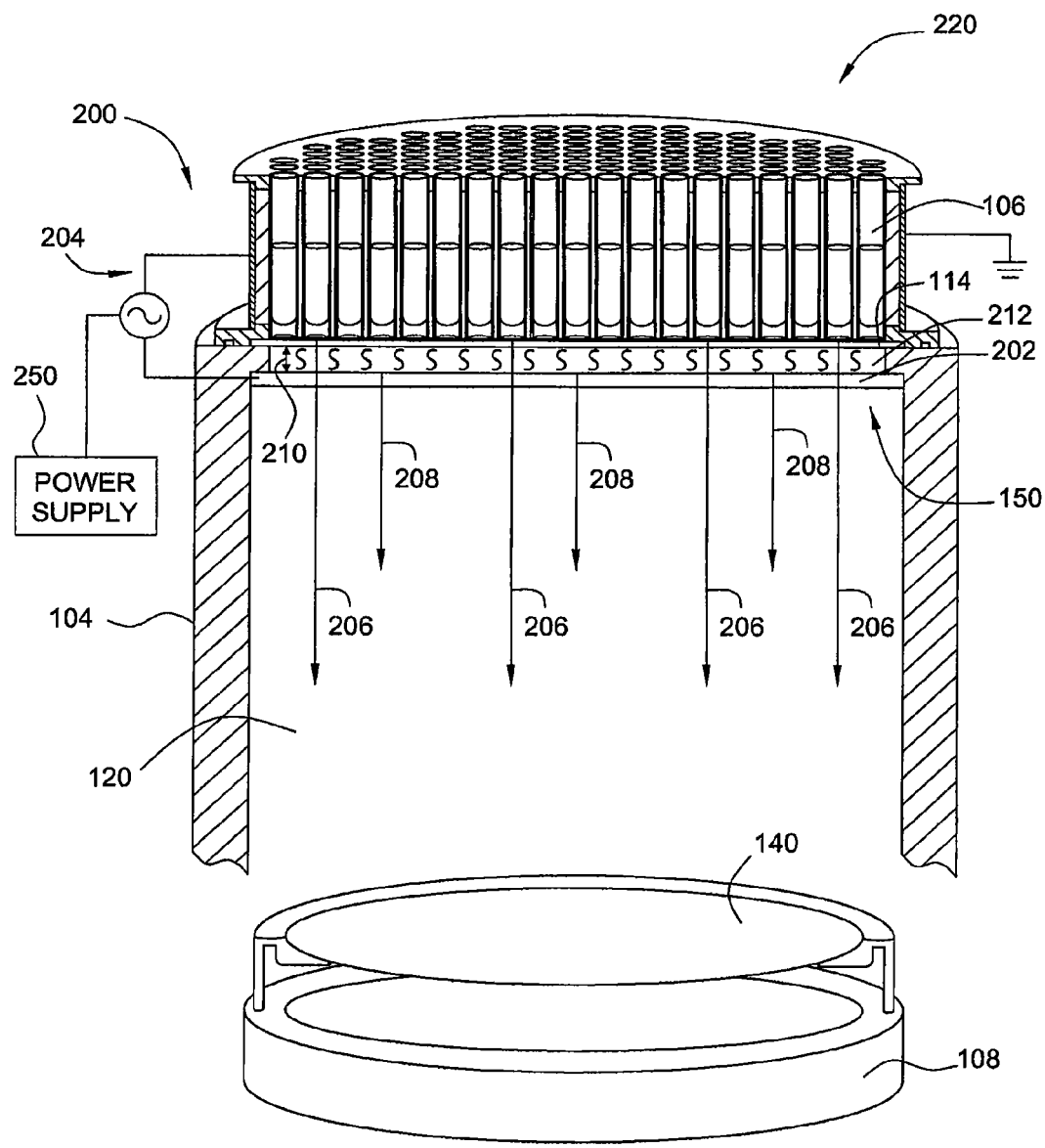
FIG. 2 is another sectional perspective view of one embodiment of a thermal processing chamber with dielectric barrier discharge assembly.

FIG. 2 is one embodiment of a DBD lamp assembly 150 disposed in a thermal processing chamber 200. The DBD lamp assembly 150 includes a first electrode 220, a dielectric barrier 114, and a second electrode 202. The first electrode 220 is grounded. The second electrode 202 is insulated from the chamber body (insulation not shown in the Figures). The dielectric barrier 114 is disposed between the first electrode 220 and the second electrode 202 and maintains the first electrode 220 and the second electrode 202 in a spaced-apart relation. The DBD lamp assembly 150 is configured to generate radiant energy to energize the surface of the substrate 140. In one embodiment, the first electrode 220 is the radiant heat assembly 106 described in FIG. 1. In another embodiment, the first electrode 220 may have other configuration, suitable for providing radiant energy to the substrate.

The second electrode 202 is an electrical conductive material configured to deliver electricity and allow the generated radiant energy to pass therethrough. In one embodiment, the second electrode 202 is a wire grid, a metal mesh, a perforated metal, an expanded metal, or other conductive web material. Suitable materials of the second electrode 202 include, but not limited to, aluminum, stainless steel, tungsten, copper, molybdenum, nickel, and other metal material. In another embodiment, the second electrode 202 may be a conductive material as described above but coated with a dielectric layer. In yet another embodiment, the second electrode 202 may be a conductive material coated onto a dielectric layer in an open pattern. The dielectric layer may be a transparent dielectric layer or a sufficiently thin dielectric layer that facilitates the transmission of the radiation energy. Suitable materials of the dielectric layer include, but not limited to MgO, $SiO_2$, $Y_2O_3$, $La_2O_3$, $CeO_2$, SrO, CaO, $MgF_2$, $LiF_2$, and $CaF_2$, among others. The conductive material could be indium tin oxide (ITO), $SnO_2$, W, Mo, Cu, or another metal.

The dielectric barrier 114 acts as a current limiter during energizing process and prevents the radiant energy from transitioning to a sustained arc discharge. In one embodiment, the dielectric barrier 114 is a transparent dielectric material that allows the radiant energy to be emitted therethrough. In another embodiment, the dielectric barrier 114 is a transparent dielectric material such as glass, quartz, ceramics, or other suitable polymers. In yet another embodiment, the dielectric material is the quartz window 114, as described in FIG. 1.

A discharge space 212 is defined between the dielectric barrier 114 and second electrode 202 in the processing chamber 200. A discharge gas is supplied into the discharge space 212. The discharge space 212 has a selected discharging distance 210 creating a discharge volume to allow sufficient collisions among the electrons and the discharge gas executed in the discharge space 212. The discharge volume is configured to sufficiently promote the collisions of the electrons and the discharge gas so that excited species, including excimers, may be created, thereby generating the UV radiation as desired. In one embodiment, the discharge distance 210 is selected within an adequate range to promote the collisions in the discharge space 212. In another embodiment, the discharge distance 210 is selected between about 0.1 centimeters and about 100 centimeters, for example, between about 2 centimeters and about 20 centimeters. Additionally, the pressure in the discharge space 212 may be maintained at between about 0.5 Torr and about 600 Torr.

The collision of electrons with the discharge gas provides energy to the discharge gas creating reactive species including discharge plasma species and excimers. Some energized reactive species emit radiation energy, e.g, photons, creating UV radiation emitting to the surface of the substrate 140. The surface of the substrate 140 absorbs the photons, activating the surface of the substrate 140 into an energetic state. The energized surface of the substrate 140 promotes the reaction of the substrate, for example, an annealing process or a surface rearrangement. In one embodiment, the discharge gas may be oxygen gas ($O_2$). In another embodiment, the discharge gas may be a gas mixture selected from a group including oxygen gas ($O_2$) and noble gases, such as xenon gas (Xe), krypton gas (Kr), argon gas (Ar), neon gas (Ne), helium gas (He) and the like. In yet another embodiment, the discharge gas may be a gas mixture including at least one of oxygen gas ($O_2$), noble gases, a halogen containing gas, fluorine, bromine, chlorine gas, an iodine containing gas, $H_2O$, and $NH_3$.

A process gas may be supplied into the interior volume 120 of the process chamber 200 to optimize the process conditions as required. The process gas supplied into the interior volume 120 is excited by the UV radiation from the DBD lamp assembly 150, creating excited gas species to the surface of the substrate 140. The excited gas species as well as the reactive species energized from the discharge gas activate the surface of the substrate into an energetic state, thereby triggering the photochemical reaction on the substrate 140 and allowing the substrate 140 being intensively and uniformly processed. As the embodiment depicted in FIG. 2, as the second electrode 202 is configured to be a metal mesh or wire grid material, the discharge gas may flow though the second electrode 202 and across to the substrate surface 140 as the process gas. In another embodiment, the process gas may be different from the discharge gas individually supplied into the surface of the substrate 140. The process gas may include at least one of oxygen gas ($O_2$), noble gases, a halogen containing gas, $H_2O$, $N_2O$, $N_2$ or $NH_3$.

A circuit arrangement 204 applies an operating voltage from a power source 250 to the first electrode 220 and the second electrode 202. In operation, the voltage applied to the two electrodes 220, 202 establishes an electric field that promotes the electrons being collided in the discharge space 212. The electron collision generates an energy to the discharge gas in the discharge space 212, thereby energizing the discharge gas into an excited state which typically refers as reactive species, discharge species, or excimers. The reactive species subsequently recombine to release energy as a form of radiation, e.g., UV photons. The radiant energy 208 travels to surface of the substrate 140 promoting the photochemical process and reaction. The UV radiation 208 yields higher photon energies, thereby facilitating photochemical reaction occurred on the surface of the substrate 140, thus enabling the substrate to be uniformly processed. Additionally, the radiant heat assembly 106 also generates thermal radiation energy 206 diffusing as well as the radiant energy 208 to the surface of the substrate 104, thereby creating a combined IR and UV radiation to promote the substrate reaction. In one embodiment, the UV radiation 208 generated by the DBD lamp assembly 150 has a wavelength about 100 nm to about 400 nm. In another embodiment, the combined thermal radiation energy 206 and the UV radiation 208 generated by the DBD lamp assembly 150 and radiant heat assembly 106 has a combined IR and UV radiation at a wavelength about 100 nm to about 4000 nm.

The voltage applied by the circuit arrangement 204 from the power supply 250 is selected so that an electric field may be established that is sufficient to generate energy as described above. In one embodiment, the voltage may be applied between about 100 Volts or about 20,000 Volts, for example, about 1,000 Volts or about 5,000 Volts.

Figure 3:
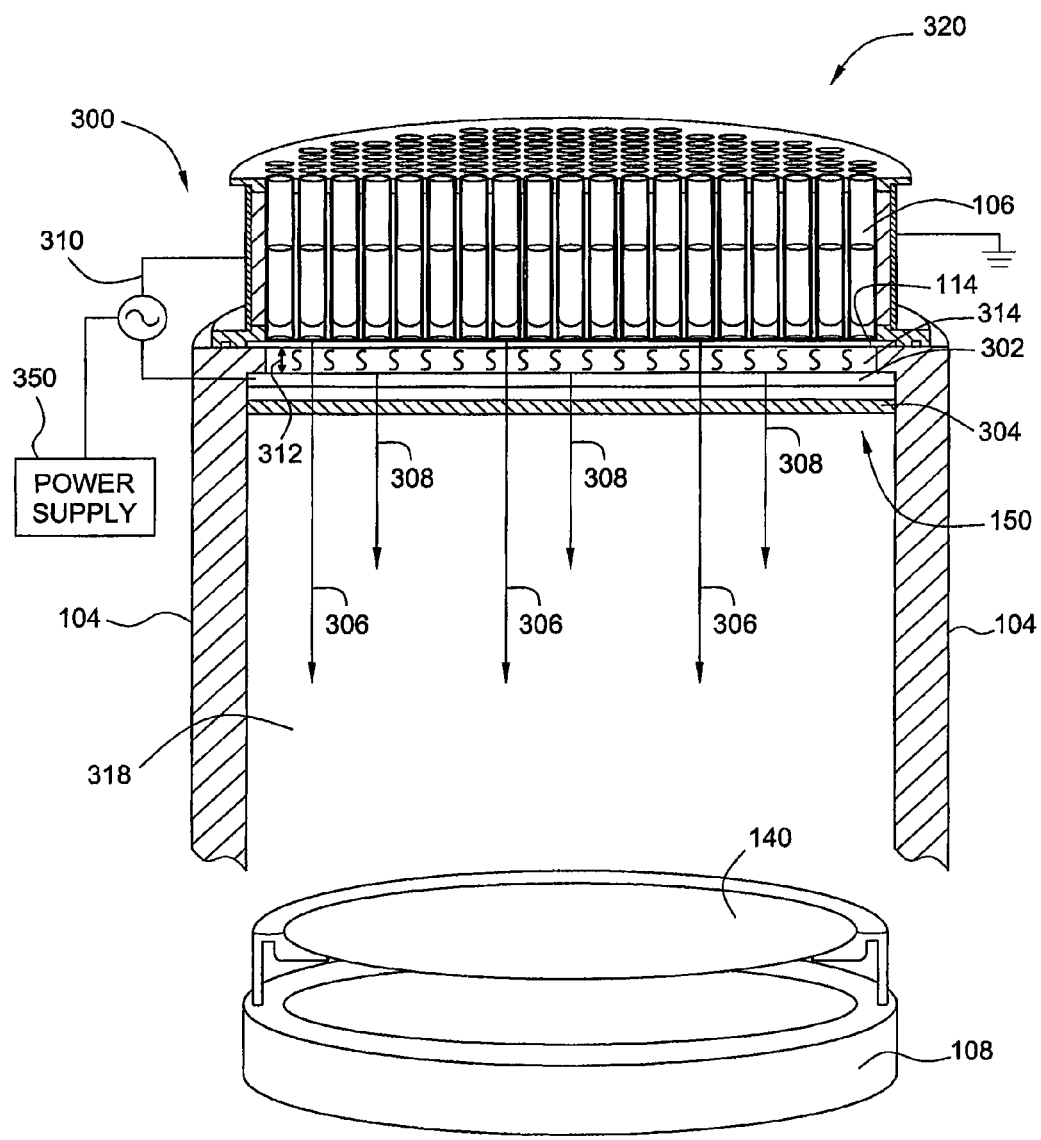
FIG. 3 is a sectional perspective view of another embodiment of a thermal processing chamber with dielectric barrier discharge lamp assembly.

FIG. 3 depicts one embodiment of a DBD lamp assembly 150 in a thermal processing chamber 300. The DBD lamp assembly 150 includes a first electrode 320, a second electrode 302, and a dielectric barrier 114. The first electrode 320 is grounded. The second electrode 302 is insulated from the chamber body (insulation not shown in the Figures). The dielectric barrier 114 is disposed between the first electrode 320 and the second electrode 302 and maintains the first electrode 320 and the second electrode 302 in a spaced-apart relation. A transparent window 304 is disposed below the DBD lamp assembly 150. It is noted that the embodiment described in FIG. 3 is substantially similar as the embodiment described in FIG. 2 except the transparent window 304 may be optionally disposed below the DBD lamp assembly 150.

The transparent window 304 disposed in the process chamber 300 isolates the DBD lamp assembly 150 from an interior volume 318. The isolated DBD lamp assembly 150 allows the discharge gas in the discharge space 314 to be contained within the DBD lamp assembly 150, thereby minimizing usage of the discharge gas. The transparent window 304 also isolates the DBD lamp assembly 150 from the interior volume 318 of the processing chamber 300, thereby prevents the unwanted plasma species and other discharge species exiting in the DBD lamp assembly 150. The undesired sputtered material associated with the DBD lamp assembly 150, e.g., particles or contaminants sourced from the bombardment of the dielectric materials, may also beneficially prevent from entering into the interior volume 318 of the processing chamber 300. Additionally, the isolated discharge space 314 prevents process gases supplied to the interior volume 318 from mixing with the discharge gas in the discharge space 314, thereby optimizing the selection of the process gas and discharge gas for various process requirements. In one embodiment, the process gas may be the same as the discharge gas. In another embodiment, the process gas supplied into the interior volume 318 is selected from a group including oxygen gas ($O_2$), noble gases, a halogen containing gas, $H_2O$, $N_2O$, $N_2$ and $NH_3$.

The transparent window 304 is fabricated form a material selected to permit radiant energy generated in the DBD lamp assembly 150 and the radiant heating assembly 106 to pass therethrough without significant energy loss. In one embodiment, the transparent window 304 is fabricated from at least one of quartz, glass substrate, $MgF_2$, $CaF_2$, or $LiF_2$.

Figure 4:
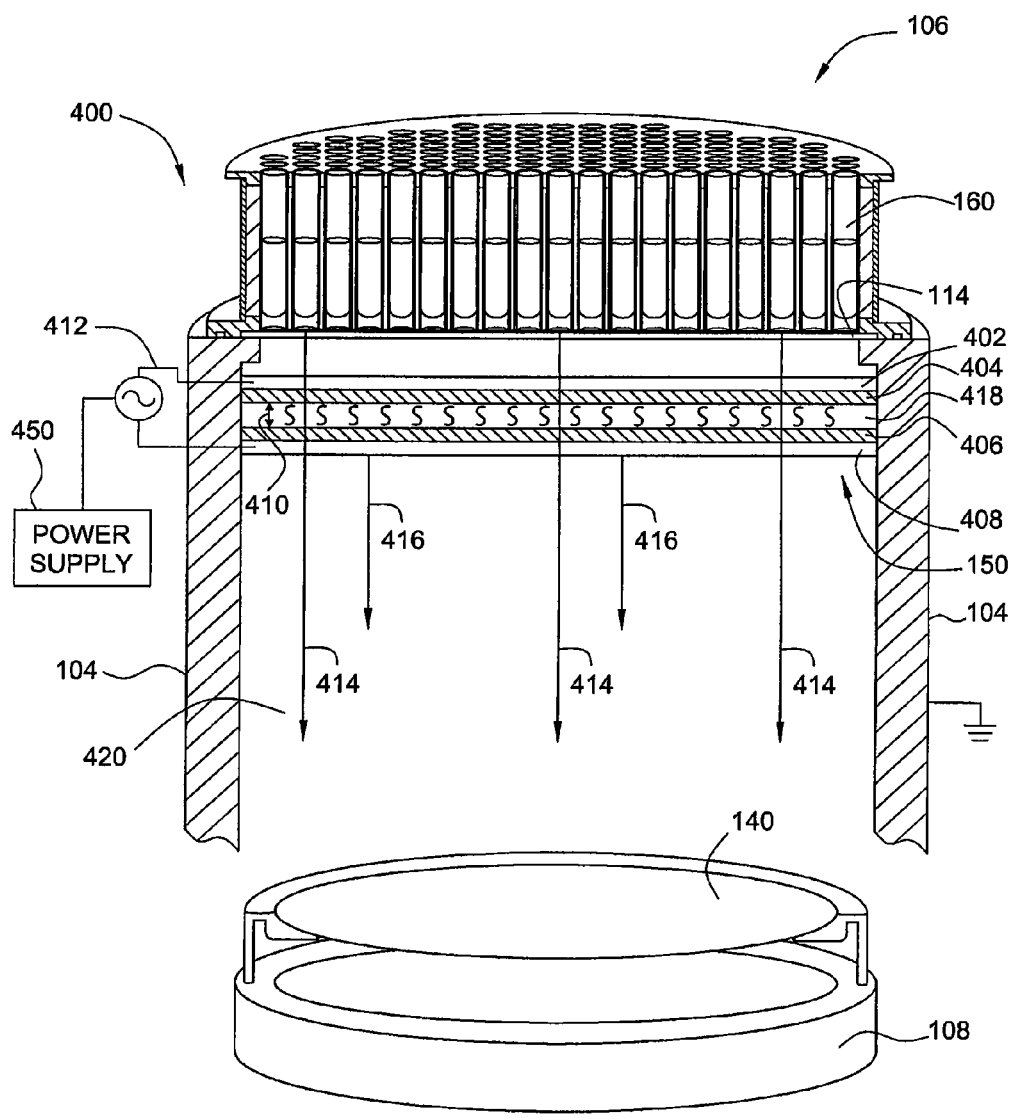
FIG. 4 is a sectional perspective view of one embodiment of a thermal processing chamber with internal isolated dielectric barrier discharge lamp assembly.

FIG. 4 depicts another embodiment of an internal isolated dielectric barrier discharge lamp assembly 150 in a thermal processing chamber 400. A radiant heat assembly 106 including honeycomb tubes 160 and a quartz window 114, as described in FIG. 1, is disposed on the top surface of the process chamber 400. The radiant heat assembly 106 and the dielectric barrier discharge lamp assembly 150 provide radiant energy through to the substrate surface 140. In one embodiment, the radiant energy generated from the radiant heat assembly 106 has IR and/or a longer wavelength UV radiation. In another embodiment, the radiant energy generated from the radiant heat assembly 106 has a wavelength of about 400 nm to about 4000 nm.

The dielectric barrier discharge lamp assembly 150 is disposed below the radiant heat assembly 106 including a first electrode 402, a second electrode 408, and dielectric barriers 404 and 406. The DBD lamp 150 may be isolated from the walls 104 of the processing chamber 400 by segments (not shown) or may have one of its electrodes grounded. In one embodiment, the electrodes 402, 408 are electrical conductive material configured to deliver electricity and allow radiant energy to be generated upon application of a voltage. In another embodiment, the electrodes 402, 408 are wire grids, metal meshes, a perforated metal, an expanded metal, or other conductive web materials. Suitable materials of the electrodes 402, 408 include, but not limited to, aluminum, stainless steel, tungsten, copper, molybdenum, nickel, and other metal alloy. In another embodiment, the electrodes 402, 408 may be a conductive material as described above but coated with a dielectric layer. In yet another embodiment, the electrodes 402, 408 may be a conductive material coated onto a dielectric layer like 404 or 406. The dielectric layer may be a transparent layer or a dielectric layer having a sufficient thin thickness that facilitates the transmission of the radiation energy. Suitable materials of the dielectric layer include, but are not limited to MgO, $SiO_2$, $Y_2O_3$, $La_2O_3$, $CeO_2$, SrO, CaO, $MgF_2$, $LiF_2$, and $CaF_2$, among others. The conductive material may be a metal already mentioned as well as indium tin oxide (ITO), or $SnO_2$.

The dielectric barriers 404 and 406 are disposed between the first electrode 402 and the second electrode 408. The dielectric barriers 404, 406 act as current limiters during the energizing process and prevent the radiant energy from transitioning into a sustained arc discharge. In one embodiment, the dielectric barriers 404, 406 are transparent dielectric materials that allow the radiant energy to be emitted therethrough. In another embodiment, the dielectric barriers 404, 406 are transparent dielectric materials such as glass, quartz, $MgF_2$, $CaF_2$, and $LiF_2$, ceramics, or other suitable polymers.

The dielectric barrier 406 may also serve as a transparent window. The transparent window 406 is fabricated from a material facilitates transfer of radiant energy generated from the DBD lamp assembly 150 and radiant heat assembly 106 to the substrate surface 140 without significant energy loss. In one embodiment, the transparent window is fabricated from quartz, glass substrate, $MgF_2$, $CaF_2$, and $LiF_2$, among others. Alternatively, in embodiments that two electrodes 402, 408 are coated with transparent dielectric layers, the transparent window 406 and the dielectric layer 404 may be omitted and replaced by the coated transparent dielectric layers as needed.

A discharge space 418 is defined between the dielectric barrier 404 and transparent window 406 in the processing chamber 400. A discharge gas is supplied into the discharge space 418. The discharge space 418 has a selected discharging distance 410 creating a discharge volume to allow sufficient collisions among the electrons and the discharge gas in the discharge space 418. The discharge volume is configured to sufficiently promote the collisions of the electrons and the discharge gas so that excited species, including excimers, are created thereby generating the UV radiation as desired. In one embodiment, the discharge distance 410 is selected within an adequate range to promote the collisions in the discharge space 418. In another embodiment, the discharge distance 410 is selected between about 0.1 centimeters and about 100 centimeters, for example, between about 2 centimeters and about 20 centimeters. Additionally, the pressure in the discharge space 418 may be maintained at between about 0.5 Torr and about 600 Torr.

The collision of electrons in the discharge space 418 provides energy to the discharge gas creating reactive species including discharge plasma species and excimers. The reactive species emit radiation energy, e.g, photons, creating UV radiation emitting to the surface of the substrate 140. As the transparent window 406 is disposed in the DBD lamp assembly 150, the discharge gas is isolated from exiting the DBD lamp assembly, thereby allowing a process gas being individually supplied to the interior volume 420 of the processing chamber 400. The UV radiation generated from the DBD lamp assembly 150 activates the process gas in the interior volume 420, creating the reactive species. The surface of the substrate 140 absorbs the reactive species generated from the process gas, thereby promoting the photochemical process and reaction of the substrate, for example, an oxidation or nitridation process. Additionally, the radiant energy generated from the radiant heat assembly 106 radiates to the substrate surface, thereby generating a combined IR and UV radiation to activate the surface of the substrate and allow a uniform and intensive process reaction on the substrate 140. In one embodiment, the discharge gas and process gas may be oxygen gas ($O_2$). In another embodiment, the discharge and process gas may be a gas mixture selected from a group including oxygen gas ($O_2$) and noble gases, such as xenon gas (Xe), krypton gas (Kr), argon gas (Ar), neon gas (Ne), helium gas (He) and the like. In yet another embodiment, the discharge gas and process gas may be a gas mixture including at least one of oxygen gas ($O_2$), noble gases, a halogen containing gas, fluorine, bromine, chlorine gas, an iodine containing gas, $H_2O$, $N_2O$, $N_2$ and $NH_3$. In still another embodiment, the process gas may be selected to be different from the discharge gas as needed.

A circuit arrangement 412 applies an operating voltage from a power source 450 to the first electrode 402 and the second electrode 408. In operation, the voltage applied to the two electrodes 402, 408 establishes an electric field that promotes the electrons being collided in the discharge space 418. The electron collision generates an energy to the discharge gas in the discharge space 418, thereby energizing the discharge gas into an excited state which is typically referred to as excited species, discharge species, or excimers. Some of these species subsequently relax to the ground state by releasing energy in the form of radiation 416, e.g., photons and/or UV radiation, from the DBD lamp assembly 150. The radiant energy 416 travels to surface of the substrate 140 promoting the photochemical process and reaction. The UV radiation 416 yields higher photon energies, thereby facilitating photochemical reaction occurring on the surface of the substrate 140, thus enabling the substrate to be uniformly thermal processed. Additionally, the radiant heat assembly 106 also generates thermal radiation energy 410 radiating as well as the radiant energy 416 to the surface of the substrate 104, thereby creating a combined IR and UV radiation to promote the substrate reaction. In one embodiment, the UV radiation 416 generated by the DBD lamp assembly 150 has a wavelength about 100 nm to about 400 nm. In another embodiment, the combined radiation energy 414 and the UV radiation 416 generated by the DBD lamp assembly 150 and radiant heat assembly 106 has a combined IR and UV radiation at a wavelength about 100 nm to about 4000 nm.

The voltage applied by the circuit arrangement 412 through the power supply 450 is selected so that a sufficient electric field may be established to generate energy. In one embodiment, the voltage may be applied between about 100 Volts and about 20,000 Volts, for example, about 1,000 Volts and about 5,000 Volts.

The transparent window 406 disposed in the process chamber 400 isolates an internal isolated discharge space 418 from an interior volume 420. The isolated discharge space 418 allows the discharge gas be contained within the DBD lamp assembly 150, thereby minimizing usage of the discharge gas. The transparent window 406 also isolates discharge gas from the interior volume 420 of the processing chamber 400, thereby prevents the unwanted plasma species and other discharge species exiting in the DBD lamp assembly 150. The undesired sputtered material associated with the DBD lamp assembly 150, e.g., particles or contaminants sourced from the bombardment of the dielectric materials, may also beneficially prevent from entering into the interior volume 420 of the processing chamber 400. Additionally, the isolated discharge space 418 prevents process gases supplied to the interior volume 420 from mixing with the discharge gas, thereby optimizing the selection of the process gas and discharge gas for various process requirements. In one embodiment, the process gas may be the same as the discharge gas. In another embodiment, the process gas supplied into the interior volume 318 is selected from a group including oxygen gas ($O_2$), noble gases, a halogen containing gas, $H_2O$, $N_2O$, $N_2$ and $NH_3$.

Figure 5:
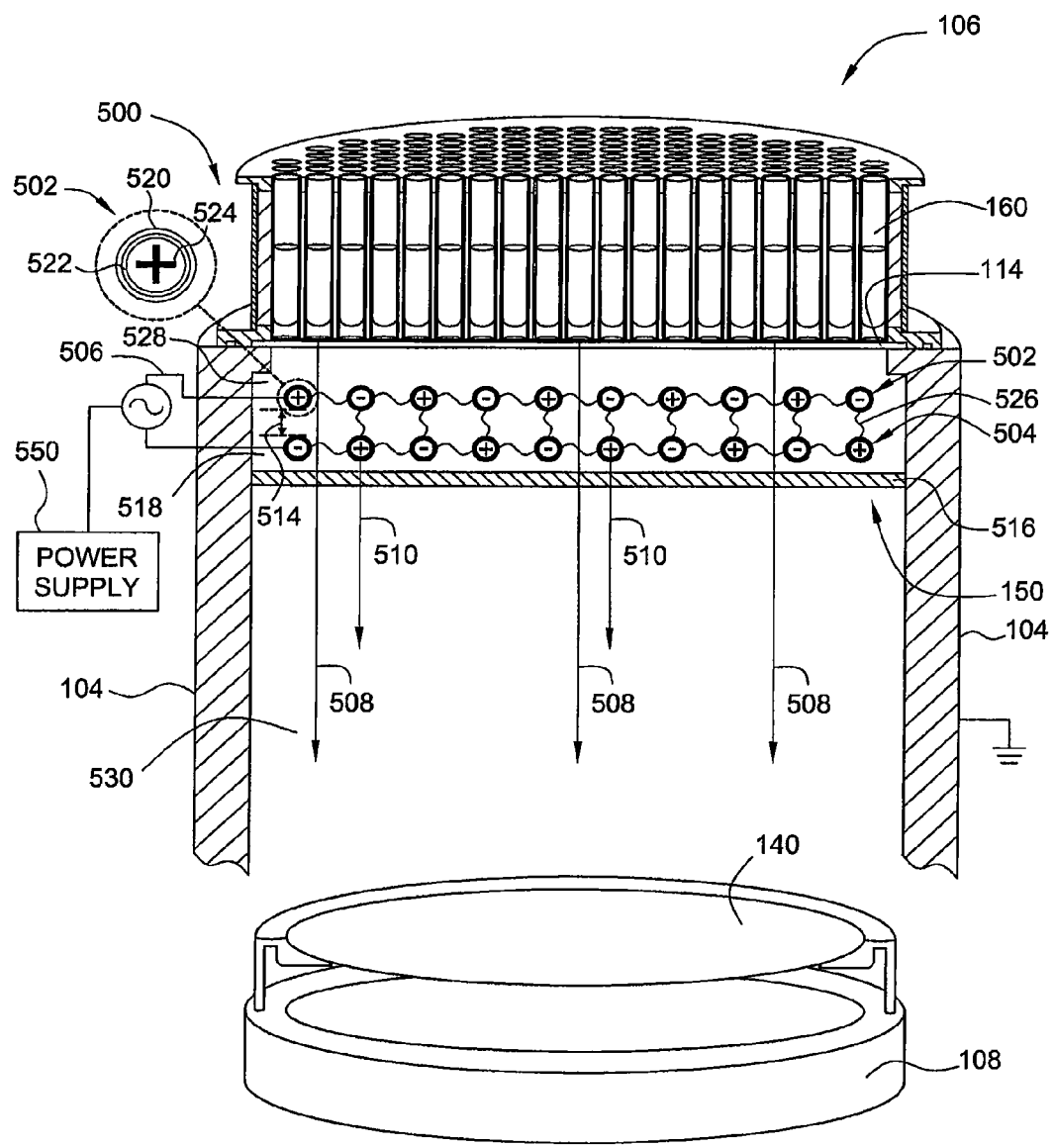
FIG. 5 is a sectional perspective view of another embodiment of a thermal processing chamber with internal isolated dielectric barrier discharge lamp assembly.

FIG. 5 depicts another embodiment of an internal isolated DBD lamp assembly 150 in a thermal processing chamber 500. A radiant heat assembly 106 including honeycomb tubes 160 and a quartz window 114, as described in FIG. 1, is disposed on the top surface of the process chamber 500. The radiant heat assembly 106 provides radiant energy 508 through the DBD lamp assembly 150 to the substrate surface 140. In one embodiment, the radiant energy 508 generated from the radiant heat assembly 106 has IR and/or a longer wavelength of UV radiation. In another embodiment, the radiant energy 508 generated from the lamp assembly 106 has a radiation at wavelength about 400 nm to about 4000 nm.

The DBD lamp assembly 150 includes a first electrode 502 and a second electrode 504. The electrodes 502, 504 include a dielectric layer 520 coated on a conductive cylinder 522 having a hollow passage 524 in the center of the cylinder 522, thereby allowing a coolant fluid to flow therefrom. In one embodiment, the electrodes 502, 504 are configured an array of two rows positioned parallel to each other. In another embodiment, the electrodes 502, 504 may be two conductive sheets positioned parallel to each other. In yet another embodiment, the electrodes 502, 504 are electrical conductive material configured to deliver electricity and allow radiant energy to be generated upon applying a voltage. Suitable materials of the electrodes include, but not limited to, aluminum, stainless steel, nickel, and other metal alloy.

The dielectric layer 520 coated on the cylinder 522 is a dielectric material. The dielectric layer may be a transparent layer or a dielectric having a sufficient thin thickness that facilitates the emission the radiation energy. In one embodiment, the dielectric material is selected from a group including MgO, $SiO_2$, $Y_2O_3$, $La_2O_3$, $CeO_2$, SrO, CaO, $MgF_2$, $LiF_2$, and $CaF_2$, among others. Since there can be large spaces between the electrodes, the requirement of transparency for the dielectric may be relaxed.

The coolant fluid 524 may be supplied to the hollow passage 524 of the cylinder 522 to regulate the temperature of the cylinder 522 as need. In one embodiment, the coolant fluid may be deionized water or other suitable heat transfer medium.

A discharge space 526 is defined between the dielectric barrier 502 and the second electrode 504. A discharge gas is supplied into the discharge space 526. The discharge space 526 has a selected discharging distance 514 creating a discharge volume to allow sufficient collisions among the electrons and the discharge gas in the discharge space 526. In one embodiment, the discharge distance 514 is selected within an adequate range to promote the collisions in the discharge space 526. In another embodiment, the discharge distance 514 is selected between about 0.1 centimeters and about 100 centimeters, for example, between about 2 centimeters and about 20 centimeters. Additionally, the pressure in the discharge space 526 may be maintained at between about 0.5 Torr and about 600 Torr.

The collision of electrons in the discharge space 526 provides energy to the discharge gas creating reactive species including discharge plasma species and excimers. In one embodiment, the discharge gases may be oxygen gas ($O_2$). In another embodiment, the discharge gas may be a gas mixture selected from a group including oxygen gas ($O_2$) and noble gases, such as xenon gas (Xe), krypton gas (Kr), argon gas (Ar), neon gas (Ne), helium gas (He) and the like. In yet another embodiment, the discharge gas may be a gas mixture including at least one of oxygen gas ($O_2$), noble gases, a halogen containing gas, fluorine, bromine, chlorine gas, an iodine containing gas, $H_2O$, and $NH_3$.

A transparent window 516 may be optionally disposed below the second electrode 504. The transparent window 506 is fabricated from a material that facilitates transfer of radiant energy generated from the DBD lamp assembly 150 to the substrate surface 140 without significant energy loss. In one embodiment, the transparent window is fabricated from quartz, glass substrate, $MgF_2$, $CaF_2$, and $LiF_2$, among others.

A circuit arrangement 506 applies an operating voltage from a power source 550 to the first electrode 502 and the second electrode 504. In operation, the voltage applied to the two electrodes 502, 504 establishes an electric field that promotes the electrons being collided in the discharge space 526. The electron collision generates an energy to the discharge gas in the discharge space 526, thereby energizing the discharge gas into an excited state which typically refers as excited species, discharge species, or excimers. The excited species subsequently relax to the ground state thereby releasing energy as a form of radiation 510, e.g., photons and/or UV radiation, from the DBD lamp assembly 150. As the transparent window 516 is disposed in the DBD lamp assembly 150, the discharge gas is isolated from exiting the DBD lamp assembly, thereby allowing a process gas being individually supplied to the interior volume 530 of the processing chamber 500. The UV radiation generated from the DBD lamp assembly 150 activates the process gas in the interior volume 530, creating the reactive species. The surface of the substrate absorbs the reactive species generated from the process gas, thereby promoting the photochemical process and reaction of the substrate, for example, an oxidizing or oxynitridating process. Additionally, the radiant heat assembly 106 also generates thermal radiation energy 508 diffusing along with the radiant energy 510 to the surface of the substrate 104, thereby creating a combined IR and UV radiation to promote the substrate reaction. In one embodiment, the UV radiation 510 generated by the DBD lamp assembly 150 has a wavelength about 100 nm to about 400 nm. In another embodiment, the combined radiation energy 508 and the UV radiation 510 generated by the DBD lamp assembly 150 and radiant heat assembly 106 has a combined IR and UV radiation at a wavelength about 100 nm to about 4000 nm.

Figure 6:
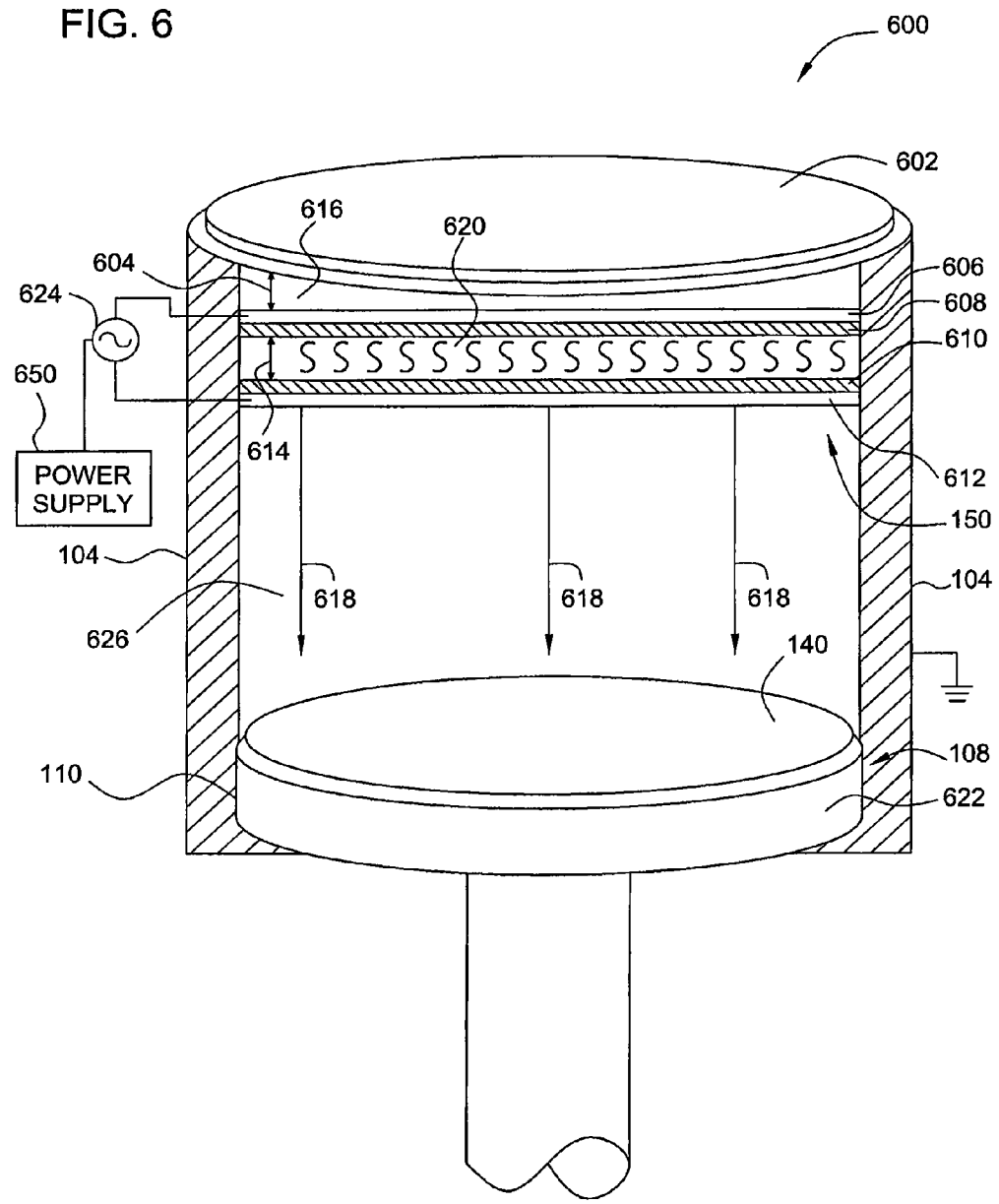
FIG. 6 is a sectional perspective view of another embodiment of a thermal processing chamber with dielectric barrier discharge lamp assembly with a heat assembly disposed in the substrate support.

The voltage applied by the circuit arrangement 506 through the power supply 550 is selected so that a sufficient electric field may be established to energize the discharge gas. In one embodiment, the voltage may be applied between about 100 Volts or about 20,000 Volts, for example, about 1,000 Volts or about 5,000 Volts. More complicated electrode powering arrangements may be employed whereby power may not uniformly applied to the entire electrode set but alternated rapidly amongst subsets of electrodes to improve the uniformity of the DBD lamp assembly The transparent window 516 disposed in the process chamber 500 isolates the DBD lamp assembly 150 from an interior volume 530. The isolated DBD lamp assembly 150 allows the discharge gas in the discharge space 526 be contained within the DBD lamp assembly 150, thereby minimizing usage of the discharge gas. The transparent window 504 also isolates discharge gas from the interior volume 530 of the processing chamber 500, thereby prevents the unwanted plasma species and other discharge species exiting in the DBD lamp assembly 150. The undesired sputtered material associated with the DBD lamp assembly 150, e.g., potential particles or contaminate sourced from the bombardment of the dielectric materials, may also beneficially prevent from entering into the interior volume 530 of the processing chamber 500. Additionally, the isolated DBD lamp assembly 150 prevents process gases supplied to the interior volume 530 from mixing with the discharge gas, thereby optimizing the selection of the process gas and discharge gas for various process requirements. In one embodiment, the process gas may be the same as the discharge gas. In another embodiment, the process gas supplied into the interior volume 530 is selected from a group including oxygen gas ($O_2$), noble gases, a halogen containing gas, $H_2O$, $N_2O$, $N_2$ and $NH_3$ FIG. 6 depicts another embodiment of an internal isolated dielectric barrier discharge lamp assembly 150 in a thermal processing chamber 600. The process chamber 600 includes a chamber lid 602 mounted on the top of the chamber 600. A heat assembly 622 is embedded in the substrate support 108 disposed on the bottom 110 of the process chamber 600. A dielectric barrier discharge lamp assembly 150 is disposed below the chamber lid 602 including a first electrode 606, a second electrode 612, and a dielectric barrier 608. Alternatively, the first electrode 606 may be configured to be the chamber lid 602 of the processing chamber 600. In one embodiment, the electrodes 606, 612 are electrical conductive material configured to deliver electricity and allow radiant energy to be generated upon application of a voltage. In another embodiment, the electrodes are wire grids, metal meshes, perforated metals, expanded metals, or other conductive web materials. Suitable materials of the electrodes 606, 612 include, but not limited to, aluminum, stainless steel, nickel, and other metal alloy. In yet another embodiment, the electrodes 606, 612 may be a conductive material coated with a dielectric layer. Suitable materials of the dielectric layer include, but not limited to, MgO, $SiO_2$, $Y_2O_3$, $La_2O_3$, $CeO_2$, SrO, CaO, $MgF_2$, $LiF_2$, and $CaF_2$, among others.

An interior space 616 is created between the chamber lid 602 and the dielectric barrier discharge lamp assembly 150. The interior space 616 has a distance 604 configured to maintain the chamber lid 602 and DBD lamp assembly 150 in a spaced-apart relation. The distance 604 is selected to prevent contact between the chamber lid 602 and the DBD lamp assembly 150 during processing. In one embodiment, the distance 604 is selected between 0.1 to 200 millimeter, for example 1 to 60 millimeter.

A cooling fluid may be optionally supplied to the interior space and remove the heat generated by the DBD lamp assembly 150. In one embodiment, the cooling fluid may be deionized water or other suitable heat transfer medium.

The dielectric barrier 608 is disposed below the first electrode 606 and the second electrode 612. The dielectric barrier 608 acts as a current limiter during energizing process and prevents the radiant energy transiting into a sustained arc discharge. The dielectric barrier may allow the radiation energy from the DBD discharge space 620 to transmit therethrough. In one embodiment, the dielectric barrier 608 and/or the first electrode 606 may be a reflector configured to reflect the radiation energy from the DBD discharge space 620, thereby maximizing the radiation energy delivered to the substrate from the DBD assembly 150. In another embodiment, the dielectric barrier may be a transparent dielectric layer or a dielectric layer having a sufficient thin thickness that facilitates the transmission of the radiation energy. In one embodiment, the dielectric barrier 608 is a transparent dielectric material such as glass, quartz, ceramics, or other suitable polymers. In embodiments where the dielectric barrier 608 is configured as a reflector, the dielectric barrier 608 may be constructed as a multilayer dielectric interference film.

A transparent window 610 is disposed between the dielectric barrier 608 and the second electrode 612. The transparent window 610 is fabricated from a material which facilitates transfer of radiant energy generated by the DBD lamp assembly 150 to the substrate surface 140 without significant energy loss. In one embodiment, the transparent window is fabricated from quartz, glass substrate, $MgF_2$, $CaF_2$, and $LiF_2$, among others. Alternatively, in embodiments that two electrodes 606, 612 are coated with transparent dielectric layers, the transparent window 610 and the dielectric layer 608 may be omitted and replaced by the coated transparent dielectric layers as needed.

A discharge space 620 is defined between the dielectric barrier 608 and the transparent window 610. Discharge energy may be supplied into the discharge space 620. The discharge space 620 has a selected discharging distance 614 creating a discharge volume to allow sufficient collisions between the electrons and the discharge gas in the discharge space 620. In one embodiment, the discharge distance 614 is selected within an adequate range to promote the collisions in the discharge space 620. In another embodiment, the discharge distance 614 is selected between about 0.1 centimeters and about 100 centimeters, for example, between about 2 centimeters and about 20 centimeters. Additionally, the pressure in the discharge space 620 may be maintained at between about 0.5 Torr and about 600 Torr. In one embodiment, the discharge gases may be oxygen gas ($O_2$). In another embodiment, the discharge gas may be a gas mixture selected from a group including oxygen gas ($O_2$) and noble gases, such as xenon gas (Xe), krypton gas (Kr), argon gas (Ar), neon gas (Ne), helium gas (He) and the like. In yet another embodiment, the discharge gas may be a gas mixture including at least one of oxygen gas ($O_2$), noble gases, a halogen containing gas, fluorine, bromine, chlorine gas, an iodine containing gas, $H_2O$, $N_2O$, $N_2$ and $NH_3$.

A process gas may be supplied into the interior volume 626 of the process chamber 600 to optimize the process conditions as required. In one embodiment, the process gas may be the same gas as the discharge gas. In another embodiment, the process gas may be different from the discharge gas individually supplied into the surface of the substrate 140. The process gas may include at least one of oxygen gas ($O_2$), noble gases, a halogen containing gas, $H_2O$, $N_2O$, $N_2$ or $NH_3$.

A circuit arrangement 624 applies an operating voltage from a power source 650 to the first electrode 606 and the second electrode 612. In operation, the voltage applied to the two electrodes 606, 612 establishes an electric field that promotes the electrons being collided in the discharge space 620. The electron collision generates an energy to the discharge gas in the discharge space 620, thereby energizing the discharge gas into an excited state which typically refers as reactive species, discharge species, or excimers. The reactive species subsequently recombine to release energy as a form of radiation 618, e.g., photons and/or UV radiation, from the DBD lamp assembly 150. The radiant energy 618 travels to surface of the substrate 140 promoting the photochemical process and reaction. As the transparent window 610 may be disposed in the DBD lamp assembly 150, the discharge gas is isolated from exiting the DMD lamp assembly, thereby allowing the process gas being individually supplied to the interior volume 626 of the processing chamber 600. The UV radiation generated from the DBD lamp assembly 150 activates the process gas in the interior volume 626, creating the reactive species. The surface of the substrate absorbs the reactive species generated from the process gas, thereby promoting the photochemical process and reaction of the substrate, for example, an oxidizing or nitriding process. In one embodiment, the UV radiation 618 generated by the DBD lamp assembly 150 has a wavelength about 100 nm to about 400 nm. In another embodiment, the UV radiation 618 generated by the DBD lamp assembly 150 includes a longer wavelength between about 100 nm to about 2000 nm.

The transparent window 610 disposed in the process chamber 600 isolates the discharge space 620 from an interior volume 626 of the processing chamber 600. The isolated discharge space 620 allows the discharge gas be contained within the DBD lamp assembly 150, thereby minimizing usage of the discharge gas. The transparent window 610 also isolates discharge gas from the interior volume 626 of the processing chamber 600, thereby prevents the unwanted plasma species and other discharge species exiting in the DBD lamp assembly 150. The undesired sputtered material associated with the DBD lamp assembly 150, e.g., potential particles or contaminate sourced from the bombardment of the dielectric materials, may also beneficially prevent from entering into the interior volume 626 of the processing chamber 600. Additionally, the isolated discharge space 614 prevents process gases supplied to the interior volume 626 from mixing with the discharge gas, thereby optimizing the selection of the process gas and discharge gas for various process requirements. In one embodiment, the process gas may be the same as the discharge gas. In another embodiment, the process gas supplied into the interior volume 626 is selected from a group including oxygen gas ($O_2$), noble gases, a halogen containing gas, $H_2O$, $N_2O$, $N_2$ and $NH_3$ Thus, an apparatus of a thermal processing chamber with a dielectric barrier discharge lamp assembly and a method for using the same is provided. The apparatus and method provided herein advantageously provide combined UV and IR radiant energy, thereby allowing the substrate to be more efficiently processed as compared to the conventional thermal processing chambers.

While the foregoing is directed to the preferred aspects of the invention, other and further aspects of the invention may be devised without departing from the basic scope thereof, and the scope thereof is determined by the claims that follow.

The invention claimed is:

1. A method for thermally processing a semiconductor substrate in a process chamber, comprising:
    generating a thermal radiation energy at a first wavelength by a radiant heat assembly disposed in a process chamber; and
    generating a UV radiation energy at a second wavelength different from the first wavelength by a dielectric barrier discharge lamp assembly disposed in the process chamber, wherein the thermal radiation energy from the radiant heat assembly emits through the dielectric barrier discharge lamp assembly, forming a combined radiation energy transmitting onto a substrate disposed in the process chamber.

2. The method claim 1, wherein the dielectric barrier discharge lamp assembly comprises:
    a first electrode and a second electrode, the first and the second electrode in a spaced-apart relation;
    a dielectric barrier between the first and the second electrode; and
    a discharge space defined between the dielectric barrier and the second electrode.

3. The method of claim 2 further comprising:
    supplying a discharge gas within the discharge space.

4. The method of claim 3, wherein the step of supplying a discharge gas further comprises:
    exciting the discharge gas by supplying a voltage to the first and second electrodes.

5. The method of claim 3, wherein the discharge gas is selected from a group consisting of $O_2$, Xe, Kr, Ar, Ne, He, halogen containing gas, $H_2O$ and $NH_3$.

6. The method of claim 1, wherein
    the second wavelength of the UV radiation energy generated by the dielectric barrier discharge lamp assembly is between about 100 nm and about 400 nm.

7. The method of claim 4, wherein exciting the discharge gas further comprising:
    supplying a voltage between about 1000 volts and about 500 volts to the first and the second electrodes.

8. The method of claim 3, wherein the dielectric barrier is fabricated from a transparent material selected from a group consisting of glass, quartz, ceramics and polymers.

9. The method of claim 3, wherein the process chamber comprises:
    a transparent window disposed below the second electrode.

10. The method of claim 9, wherein the transparent window is fabricated from a material selected from a group consisting of quartz, glass, $MgF_2$, $CaF_2$, and $LiF_2$.

11. The method of claim 3, wherein the first and the second electrodes are wire grids, metal meshes perforated metal, expanded metal or conducive web materials.

12. The method of claim 3, wherein the first and the second electrodes are fabricated from a material selected from a group consisting of aluminum, stainless steel, tungsten, copper, molybdenum and nickel.

13. The method of claim 3, wherein the discharge space has a discharge distance between about 0.1 centimeters and about 100 centimeters.

14. The method of claim 3 further comprising:
   maintaining a pressure in the discharge space of between about 0.5 Torr and about 600 Torr.

15. The method of claim 3, wherein the first and the second electrodes include a dielectric layer coated on a conductive cylinder.

16. The method of claim 15 further comprising:
   flowing a coolant fluid through a hollow passage of the conductive cylinder.

17. The method of claim 3, wherein the first electrode is a lid of the process chamber.

18. The method of claim 3, further comprising:
   supplying a process gas to an interior volume of the process chamber above the surface of the substrate.

19. The method of claim 1, wherein the radiant heat assembly is configured to provide the radiation energy having the first wavelength between about 400 nm and about 4000 nm.

* * * * *